United States Patent
Doi

(10) Patent No.: US 7,310,022 B2
(45) Date of Patent: Dec. 18, 2007

(54) CPU-BASED OSCILLATION FREQUENCY CONTROL CIRCUIT ELIMINATING THE NEED FOR A LOOP FILTER

(75) Inventor: Satoru Doi, Ota (JP)

(73) Assignee: Sanyo Electric Col, Ltd., Osaka (JP)

( * ) Notice: Subject to any disclaimer, the term of this patent is extended or adjusted under 35 U.S.C. 154(b) by 145 days.

(21) Appl. No.: 11/240,830

(22) Filed: Sep. 30, 2005

(65) Prior Publication Data
US 2006/0071720 A1 Apr. 6, 2006

(30) Foreign Application Priority Data
Oct. 1, 2004 (JP) ............................ 2004-290011

(51) Int. Cl.
*H03L 7/00* (2006.01)
(52) U.S. Cl. .............................. 331/34; 331/57; 331/74
(58) Field of Classification Search ................. 331/34, 331/57, 74
See application file for complete search history.

(56) References Cited

U.S. PATENT DOCUMENTS

| 4,048,581 A | 9/1977 | Lyberg |
| 5,495,207 A | 2/1996 | Novof |
| 5,757,238 A * | 5/1998 | Ferraiolo et al. ............. 331/16 |
| 7,061,825 B2 * | 6/2006 | Yada et al. .................. 365/233 |
| 2006/0023824 A1* | 2/2006 | Greco et al. ................. 375/371 |

FOREIGN PATENT DOCUMENTS

| JP | 10-276084 | 10/1998 |
| WO | WO2004/059847 | * 7/2004 |

OTHER PUBLICATIONS

Taiwan Intellectual Property Office, Examination Opinion Notification (English Translation) Taiwan counterpart application to U.S. Appl. No. 11/240,830, undated.

* cited by examiner

*Primary Examiner*—Robert Pascal
*Assistant Examiner*—James Goodley
(74) *Attorney, Agent, or Firm*—SoCal IP Law Group LLP; Steven C. Sereboff; John E. Gunther

(57) ABSTRACT

An oscillation frequency control circuit comprises a frequency counter that counts to measure a frequency of an oscillating signal outputted from an oscillation circuit which produces the oscillating signal of the frequency corresponding to analog control voltages inputted, a plurality of D/A converters that produce the analog control voltages respectively corresponding to digital values inputted, a digital value generator that generates the digital values according to control signals inputted, and an operation circuit that compares the frequency measured by the frequency counter with a reference frequency and produces the control signals, which are inputted to the digital value generator, corresponding to the comparing result.

11 Claims, 3 Drawing Sheets

CPU-BASED OSCILLATION FREQUENCY CONTROL CIRCUIT ELIMINATING THE NEED FOR A LOOP FILTER

CROSS-REFERENCE TO RELATED APPLICATIONS

The present application claims priority from Japanese Patent Application No. 2004-290011 filed on Oct. 1, 2004, which is herein incorporated by reference.

BACKGROUND OF THE INVENTION

1. Field of the Invention

The present invention relates to an oscillation frequency control circuit applicable to a local oscillator of a radio receiver, and the like.

2. Description of the Related Art

PLL circuits are known as being used in the local oscillator of radio receivers or the like and operable to produce stable oscillation frequencies. The PLL circuit comprises a VCO (Voltage Controlled Oscillator), a program counter that digitally sets a division ratio N, a reference frequency generator that generates a frequency as a reference (hereinafter called a "reference frequency"), a phase comparator, and a loop filter (hereinafter called an "LPF"). The oscillating signal output from the VCO is divided by the program counter to 1/N of its frequency. The divided signal output from the program counter is compared in the phase comparator with a reference signal output from the reference frequency generator, and the phase comparator outputs pulses according to the comparing results. The pulses output from the phase comparator are integrated by the LPF to produce a direct-current control voltage, which is fed back as an input voltage to the VCO. By this feed-back control, the oscillating signal having a stable frequency is obtained. By controlling the division ratio N, the oscillating signal having a desired frequency can be obtained. A PLL circuit having such a configuration is disclosed in, for example, Japanese Patent Application Laid-Open Publication No. H10-276084.

The LPF of the PLL circuit is usually constituted by elements such as a capacitor and a resistor which are connected externally to a microcomputer that controls the program counter and the division ratio N. Hence, the LPF is difficult to be made smaller, and particularly causes a problem in mounting on a device such as a wave clock. The presence of the external elements causes the production process to become complex and production cost to increase. When the PLL circuit is applied to the generation of a low frequency signal in, e.g., a time information receive circuit of a wave clock, there exists a limit for shortening the time until the PLL is in lock in frequency, which causes the increase of a receive wait time and a shorter battery lifetime. Furthermore, the integration constant of the loop filter greatly influences the switching speed, range of frequencies to which to be locked, and jitter resistance of the PLL circuit, and the loop filter is required to be carefully designed and adjusted considering relationships with others such as the VCO. Thus, the production process tends to be complex.

SUMMARY OF THE INVENTION

The present invention was made in view of the above background. An object of the invention is to provide an oscillation frequency control circuit that is small and easy to design and adjust.

A main aspect of the present invention to achieve the above object is an oscillation frequency control circuit comprising a frequency counter that counts to measure a frequency of an oscillating signal outputted from an oscillation circuit which produces the oscillating signal of the frequency corresponding to analog control voltages inputted, a plurality of D/A converters that produce the analog control voltages respectively corresponding to digital values inputted, digital value generators that generate the digital values according to control signals inputted, and an operation circuit that compares the frequency measured by the frequency counter with a reference frequency and produces the control signals, which are inputted to the digital value generators, corresponding to the comparing result.

The oscillation frequency control circuit of the present invention produces the analog control voltages to be inputted to the oscillation circuit according to the result of comparing the frequency counted by the frequency counter with the reference frequency. Hence, a loop filter is not needed as in the conventional PLL circuit, and the oscillation frequency control circuit can be made smaller and incorporated in a small-scale apparatus such as a wrist watch. External parts are not necessary, accordingly reducing production costs. Moreover, because no loop filter is used, the oscillation frequency control circuit is easy to design and adjust.

According to the invention, there is provided an oscillation frequency control circuit that is small and easy to design and adjust.

Features and objects of the present invention other than the above will become apparent from the description of this specification and the accompanying drawings.

BRIEF DESCRIPTION OF THE DRAWINGS

For a more complete understanding of the present invention and the advantages thereof, reference is now made to the following description taken in conjunction with the accompanying drawings wherein.

DESCRIPTION OF THE PREFERRED EMBODIMENTS

At least the following matters will be made clear by the explanation in the present specification and the description of the accompanying drawings.

Figure 1:
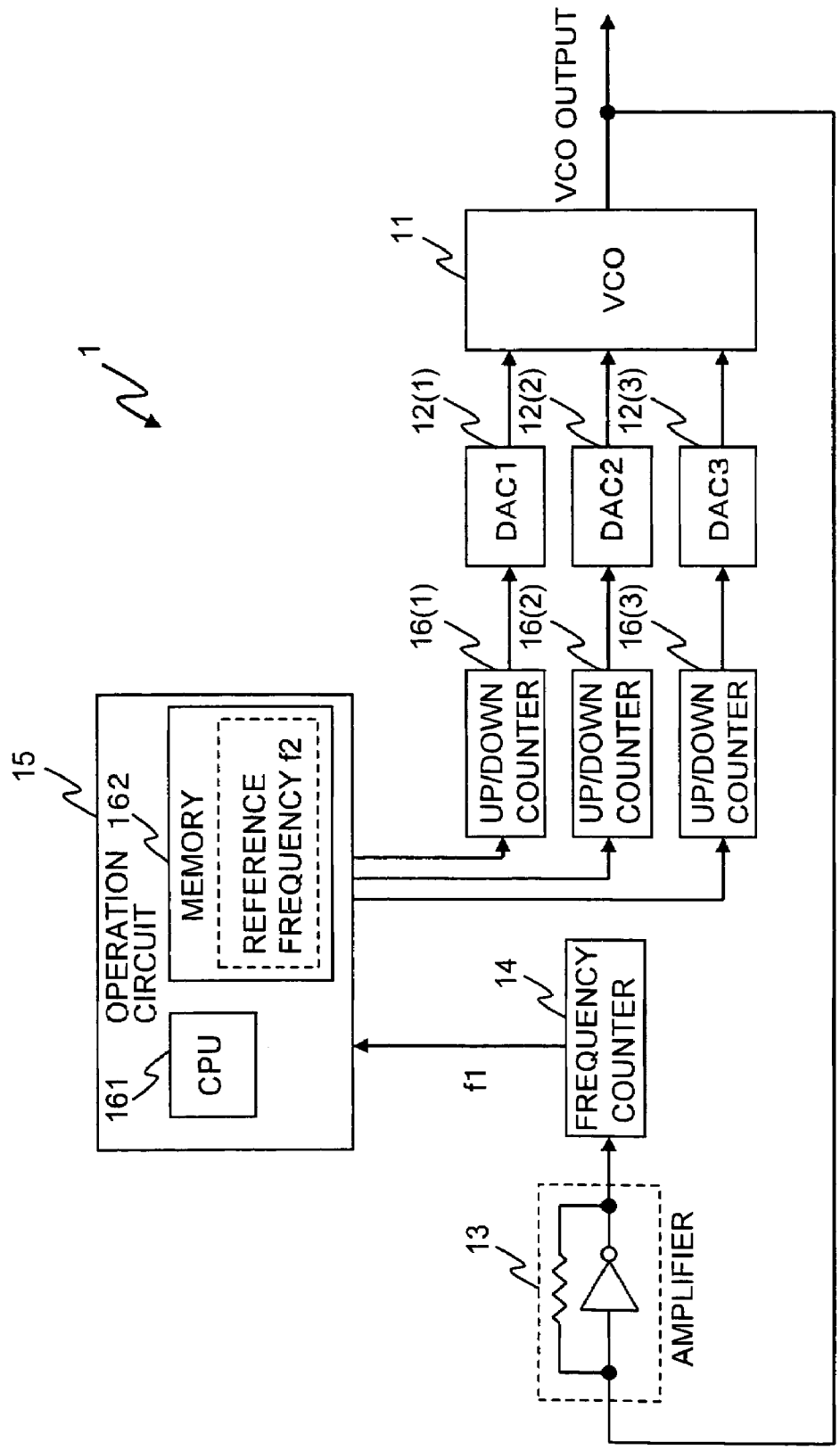
FIG. 1 illustrates the configuration of an oscillation frequency control circuit 1 described as an embodiment of the present invention.

An embodiment of the present invention will be described with reference to the drawings. FIG. 1 shows the configuration of an oscillation frequency control circuit 1, which will be explained as the embodiment of the present invention. The oscillation frequency control circuit 1 comprises a VCO (Voltage Controlled Oscillator) 11, three D/A converters 12(1) to 12(3), an amplifier 13, a frequency counter 14, an operation circuit 15, and up/down counters 16(1) to 16(3).

The VCO 11 generates the oscillating signal of a frequency corresponding to the voltage inputted thereto. The VCO 11 generates and outputs the oscillating signal of a frequency corresponding to the voltages output from the D/A converters 12(1) to 12(3) (denoted as DAC1 to DAC3 in FIG. 1). The oscillating signal output from the VCO 11 (VCO output) is supplied to circuits to use this signal such as a frequency mixer of a radio receiver. Also, the oscillating signal output from the VCO 11 is amplified by the amplifier 13 and supplied to the frequency counter 14. The frequency counter 14 counts to measure the frequency of the oscillating signal output from the VCO 11 and supplies the resulting value to the operation circuit 15.

The operation circuit 15 comprises a CPU 161 and memory 162 such as ROM and RAM. The operation circuit 15 generates control signals to control digital values that are output from the up/down counters 16(1) to 16(3) and outputs the generated control signals to the up/down counters 16(1) to 16(3). The up/down counters 16(1) to 16(3) generate the digital values according to the control signals output from the operation circuit 15, and outputs the generated digital values to the respective D/A converters 12(1) to 12(3) connected thereto. The function of the operation circuit 15 is realized by executing a program stored in the memory 162 by the CPU 161. Note that the function of the up/down counters 16(1) to 16(3) may be realized by the operation circuit 15.

The operation circuit 15 compares a frequency f1 supplied from the frequency counter 14 and a frequency f2 (the reference frequency) stored in the memory 162, and generates the control signals according to the comparing result and thereby controls the digital values that are output from the up/down counters 16(1) to 16(3), thereby stabilizing the frequency of the oscillating signal output from the VCO 11. For example, if f1<f2, the operation circuit 15 controls the digital values that are output from the up/down counters 16(1) to 16(3) such that the frequency of the oscillating signal output from the VCO 11 becomes higher. If f1>f2, the operation circuit 15 controls the digital values that are output from the up/down counters 16(1) to 16(3) such that the frequency of the oscillating signal output from the VCO 11 becomes lower. If f1=f2, the operation circuit 15 does not output the control signals, thereby keeping unchanged the digital values that are output from the up/down counters 16(1) to 16(3). Note that if the number of comparison times when f1=f2 has reached a predetermined number, time intervals at which to compare may be controlled to be increased. By this means, the number of comparison times will be reduced, thereby reducing power consumption of the oscillation frequency control circuit 1.

Figure 2:
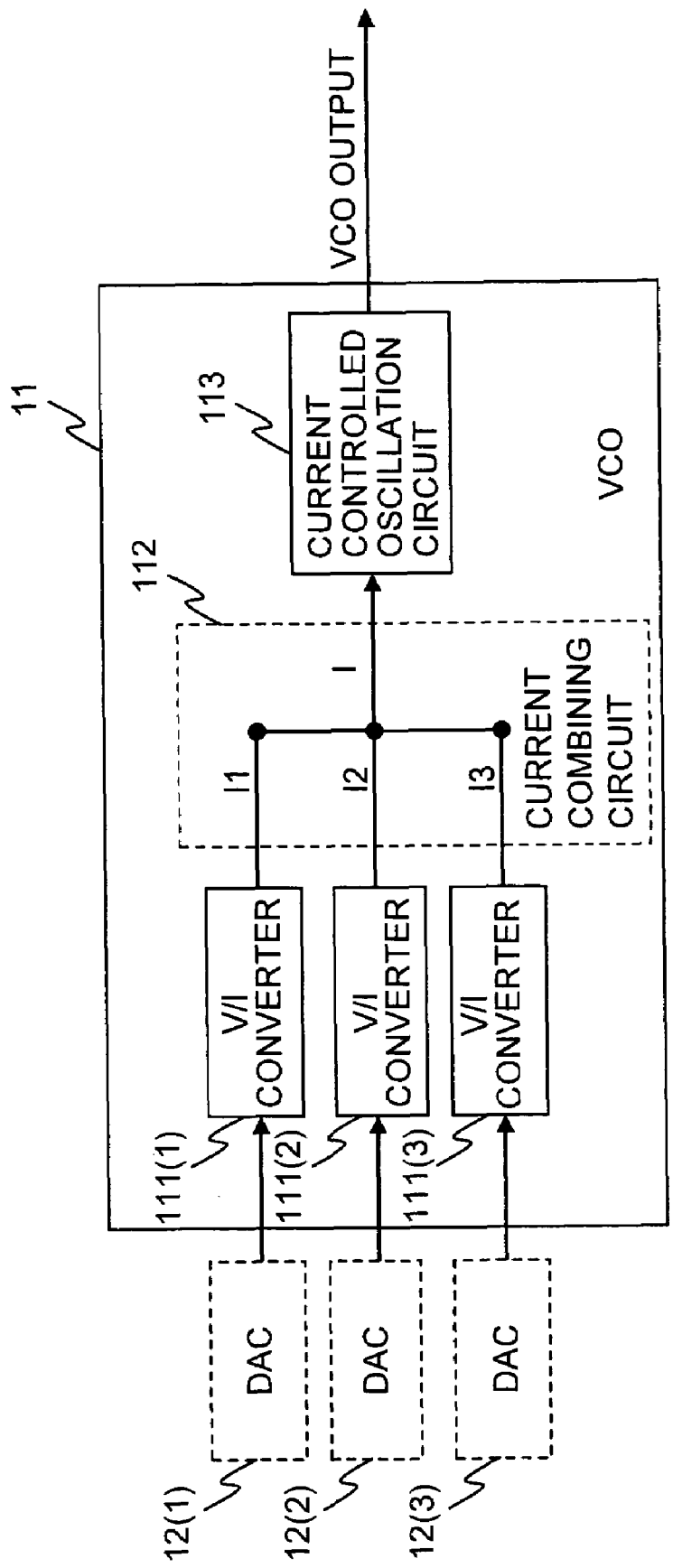
FIG. 2 illustrates the internal configuration of a VCO 11 described as an embodiment of the present invention.

Next, how the frequency of the oscillating signal output from the VCO 11 is controlled by the digital values output from the up/down counters 16(1) to 16(3) will be described. FIG. 2 shows the internal configuration of the VCO 11. The VCO 11 comprises voltage-to-current converters provided corresponding to the D/A converters 12(1) to 12(3) (hereinafter called "V/I converters 111(1) to 111(3)"), a current combining circuit 112 that outputs a combined current I of currents I1 to I3 output from the respective V/I converters 111(1) to 111(3), and a current controlled oscillation circuit 113 that produces the oscillating signal of a frequency corresponding to the combined current I output from the current combining circuit 112. Among such current controlled oscillation circuits are a circuit using a multi-vibrator and a circuit disclosed in, for example, Japanese Patent Application Laid-Open Publication No. 2004-104655.

The D/A converters 12(1) to 12(3) all output an analog voltage of the same magnitude in response to the input of the same digital value. The V/I converters 111(1) to 111(3) are different in the ratio of output current variation to input voltage variation (gradient of the output current). Between the gradients of the V/I converters 111(1) to 111(3) there is a relationship in magnitude where V/I converter 111(1)>V/I converter 111(2)>V/I converter 111(3). The input voltages given by the D/A converters 12(1) to 12(3) are of a discontinuous value. The output currents of the V/I converters 111(1) to 111(3) determined corresponding to the respective input voltages are also of a discontinuous value. The current combining circuit 112 combines the currents I1 to I3 output from the respective V/I converters 111(1) to 111(3) different in the gradient as mentioned above, and outputs the combined current I (=I1+I2+I3) to the current controlled oscillation circuit 113.

The combined current I, which causes the current controlled oscillation circuit 113 to output the oscillating signal of a desired frequency, is obtained by the V/I converter 111(1) outputting the current I1 as near the combined current I as possible in the range of I>I1, and the V/I converter 111(2) outputting the current I2 as near I−I1 as possible in the range of I−I1>I2, and the V/I converter 111(3) outputting the current I3 as near I−I1−I2 as possible in the range of I−I1−I2>I3. That is, the operation circuit 15 controls the up/down counters 16(1) to 16(3) so that the V/I converters 111(1) to 111(3) output such currents. The up/down counters 16(1) to 16(3) output the digital values according to the above control to the D/A converters 12(1) to 12(3) connected thereto respectively.

In a relationship between the V/I converters 111(1) and 111(2), the variable range of the current output from the V/I converter 111(2) is set larger than the variation in the output current of the V/I converter 111(1) corresponding to a minimum variation in the digital value output from the up/down counter 16(1). Hence, even if the V/I converter 111(1) cannot produce the current of a particular magnitude due to, for example, variation in elements and variation in temperature, noise, and variation in drive voltage, the current I of a necessary magnitude can be produced with the V/I converter 111(2). By this means, the oscillating signal of a necessary frequency can be produced stably. Such setting is made also in a relationship between the V/I converters 111(2) and 111(3).

Figure 3:
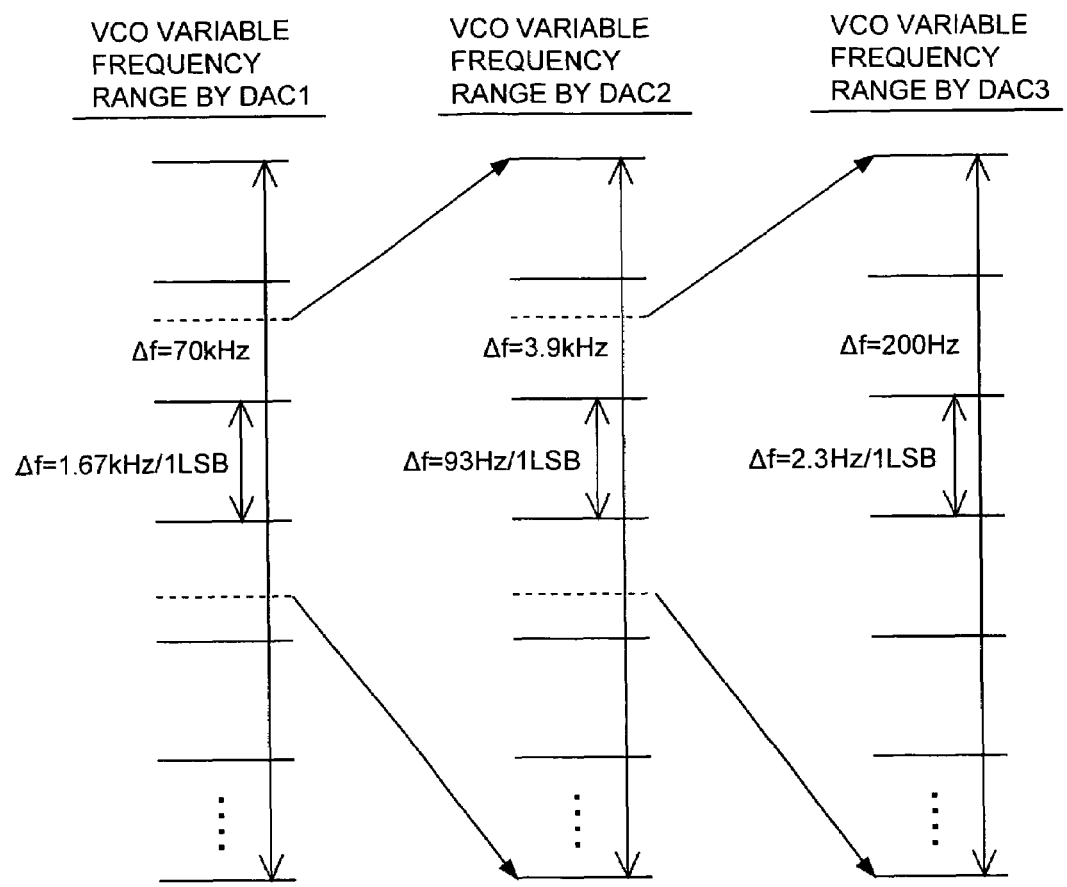
FIG. 3 illustrates an operation example of the oscillation frequency control circuit 1 described as an embodiment of the present invention.

FIG. 3 shows an operation example of the oscillation frequency control circuit 1 according to the present embodiment, where the VCO 11 outputs the oscillating signal having a frequency in the 70 kHz range of from 30 kHz to 100 kHz. In the example of the same figure, by varying the digital value inputted to the D/A converter 12(1), a frequency in the range of from 30 kHz to 100 kHz is selected; by varying the digital value input to the D/A converter 12(2), a frequency in the range of 3.9 kHz in width is selected; and by varying the digital value input to the D/A converter 12(3), a frequency in the range of 200 Hz in width is selected.

In the example of FIG. 3, when the digital value input to the D/A converter 12(1) varies by one bit, the frequency of the oscillating signal outputted by the VCO 11 varies by 1.67 kHz; when the digital value input to the D/A converter 12(2) varies by one bit, the frequency of the oscillating signal outputted by the VCO 11 varies by 93 Hz; and when the digital value input to the D/A converter 12(3) varies by one bit, the frequency of the oscillating signal outputted by the VCO 11 varies by 2.3 Hz.

In the example of FIG. 3, by adjusting the gradients of the V/I converters 111(1) and 111(2), the frequency variable range (3.9 kHz) from which the D/A converter 12(2) selects is set larger than the variation (1.67 kHz) in the frequency of the oscillating signal when the digital value input to the D/A converter 12(1) varies by one bit. Furthermore, by adjusting the gradients of the V/I converters 111(2) and 111(3), the frequency variable range (200 Hz) from which the D/A converter 12(3) selects is set larger than the variation (93 Hz) in the frequency of the oscillating signal when the digital value input to the D/A converter 12(2) varies by one bit. By this means, the oscillation frequency control circuit 1 can stably produce the oscillating signal of a necessary frequency without being affected by, for example, variation in elements and variation in temperature, noise, and variation in drive voltage.

As described above, the oscillation frequency control circuit 1 of the present embodiment produces an analog control voltage to be inputted to the VCO 11 according to the result of comparing the measured value f1 of the frequency counter 14 and the reference frequency f2. Hence, a loop filter is not needed as in the conventional PLL circuit, and the oscillation frequency control circuit can be made smaller and incorporated in a small-scale apparatus such as a wrist watch. External parts are not necessary, accordingly reducing production costs. Moreover, because no loop filter is used, the oscillation frequency control circuit is easy to design and adjust.

The oscillation frequency control circuit 1 described above has the plurality of D/A converters 12(1) to 12(3), which produce analog control voltages to decide the frequency of the oscillating signal, corresponding to digital values. If a circuit that converts multiple bits into an analog voltage consists only of a single resistor-ladder-type D/A converter, the numbers of switches and resistors are enormous (for example, in the case where frequencies in a range of 70 kHz in width are oscillated with accuracy of ±2 Hz, a D/A converter of 14 bits, the 14 being given by calculating n from $70000/2^n=4$, is needed), thus causing the increase of mounting area and cost. Furthermore, with resistor-ladder-type converters, resolution is too small (for example, in the case of a 14 bit D/A converter with drive voltage of 1 V, resolution is at $1 V/2^{14}=61 \mu V$), and easily affected by variation in supply voltage, production variation in resistors' resistance, noise, and the like, thus causing the problem that the frequency of the oscillating signal tends to become unstable.

On the other hand, in the case where as in the present embodiment, the configuration comprises a plurality of D/A converters 12(1) to 12(3), the number of bits required of one D/A converter is smaller, and hence as the D/A converters, R-2R-type circuits can be used. Hence, the numbers of switches and parts such as resistors are smaller, thus reducing mounting area. Moreover, with D/A converters constituted by R-2R-type circuits, which are smaller in resolution than resistor-ladder-type circuits (for example, in the case of a 14 bit D/A converter consisting of three 7-bit D/A converters with drive voltage of 1 V, resolution is at $1 V/2^7=7.8$ mV), the oscillation frequency control circuit 1 of the present embodiment is hardly affected by variation in supply voltage, production variation in resistors' resistance, noise, and the like, and is excellent in frequency stability.

The above description of the embodiment is provided to facilitate the understanding of the present invention and not intended to limit the present invention. It should be understood that various changes and alterations can be made therein without departing from spirit and scope of the invention and that the present invention includes its equivalents. For example, while the oscillation frequency control circuit 1 of the above embodiment uses three D/A converters and three V/I converters, the numbers of D/A converters and V/I converters are not limited to this.

What is claimed is:

1. An oscillation frequency control circuit comprising:
   a plurality of D/A converters that convert a respective plurality of digital values to produce a respective plurality of analog control voltages;
   a plurality of voltage/current converters that convert the plurality of analog control voltages into respective currents, wherein a variation in output current corresponding to a variation in input voltage being different for each of the plurality of voltage/current converters;
   a current combining circuit that combines the plurality of currents outputted from the current/voltage converters to provide a combined current;
   a current controlled oscillation circuit that produces an oscillating signal having a frequency corresponding to a value of the combined current;
   a frequency counter that counts to measure the frequency of the oscillating signal outputted from the oscillation circuit;
   an operation circuit that compares the frequency measured by the frequency counter with a reference frequency and produces control signals; and
   a digital value generator that generates the plurality of digital values according to the control signals.

2. The oscillation frequency control circuit according to claim 1, wherein the digital value generator has up/down counters.

3. The oscillation frequency control circuit according to claim 1, wherein
   a variable range of current outputted from one of the plurality of voltage/current converters is larger than variation in current outputted from another of the plurality of voltage/current converters corresponding to minimum variation in a digital value that is inputted to the D/A converter corresponding to the another of the plurality of voltage/current converters.

4. The oscillation frequency control circuit according to claim 2, wherein
   the operation circuit controls the up/down counters such that:
   one of the plurality of voltage/current converters outputs a first current as near a combined current of the current combining circuit as possible in a range smaller than the combined current; and
   another of the plurality of voltage/current converters outputs a second current as near a current obtained by subtracting the first current from the combined current as possible in a range smaller than the current.

5. The oscillation frequency control circuit according to claim 1, wherein
   the plurality of D/A converters comprises three or more D/A converters, and
   the plurality of voltage/current converters comprises three or more current voltage converters to convert analog control voltages from the three or more D/A converters into respective currents.

6. The oscillation frequency control circuit according to claim 5,
   wherein the plurality of D/A converters consists of first, second, and third D/A converters which respectively convert first, second, and third digital values into first, second, and third analog control voltages, and
   wherein the plurality of voltage/current converters consists of first, second, and third voltage/current converters which respectively convert the first, second, and third analog control voltages into first, second, and third currents.

7. The oscillation frequency control circuit according to claim 6, wherein the variation of the first current corresponding to a variation of the first analog control voltage is greater than the variation of the second current corresponding to a variation of the second analog control voltage, and the variation of the second current corresponding to a variation of the second analog control voltage is greater than the variation of the third current corresponding to a variation of the third analog control voltage.

8. A method of controlling the frequency of an oscillating signal, comprising:

converting a plurality of digital values into a respective plurality of analog control voltages;

converting the plurality of analog control voltages into respective currents using a plurality of voltage/current converters, wherein a variation in output current corresponding to a variation in input voltage being different for each of the plurality of voltage/current converters;

combining the plurality of currents outputted from the current/voltage converters to provide a combined current;

using the combined current to control the frequency of an oscillating signal produced by a current-controlled oscillation circuit;

measuring the frequency of the oscillating signal produced by the oscillation circuit using a frequency counter;

comparing the frequency measured by the frequency counter with a reference frequency and producing control signals corresponding to the comparing result; and generating the plurality of digital values according to the control signals.

9. A method of controlling the frequency of an oscillating signal according to claim 8, wherein up/down counters are used for generating the plurality of digital values.

10. The method of controlling the frequency of an oscillating signal according to claim 8, wherein:

converting a plurality of digital values into a respective plurality of analog control voltages consists of converting first, second, and third digital values into respective first, second, and third analog control voltages; and converting the plurality of analog control voltages into respective currents using a plurality of voltage/current converters consists of converting the first, second, and third analog control voltages into respective first, second, and third currents.

11. The method of controlling the frequency of an oscillating signal according to claim 10, wherein:

the variation of the first current corresponding to a variation of the first analog control voltage is greater than the variation of the second current corresponding to a variation of the second analog control voltage, and the variation of the second current corresponding to a variation of the second analog control voltage is greater than the variation of the third current corresponding to a variation of the third analog control voltage.

\* \* \* \* \*